(12) United States Patent  
Porter et al.

(10) Patent No.: US 6,931,560 B1  
(45) Date of Patent: Aug. 16, 2005

(54) PROGRAMMABLE TRANSMIT SCSI EQUALIZATION

(75) Inventors: Edson W. Porter, Colorado Springs, CO (US); Brian E. Burdick, Colorado Springs, CO (US); Todd A. Randazzo, Colorado Springs, CO (US); Kevin J. Bruno, Colorado Springs, CO (US); Stephen R. Burnham, Fort Collins, CO (US); William K. Petty, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 682 days.

(21) Appl. No.: 09/921,350

(22) Filed: Aug. 2, 2001

(51) Int. Cl.[7] .............................................. H04L 7/00
(52) U.S. Cl. ..................... 713/400; 713/375; 713/401; 713/500; 713/502; 713/503; 713/600; 327/170; 327/175; 327/473; 719/326; 719/327; 365/202; 365/203; 365/204
(58) Field of Search ............................... 713/1, 2, 400, 713/401, 500–503, 600, 375; 327/51, 112, 327/203, 309, 530, 540, 170, 175, 473; 365/202–208; 322/17, 25; 719/326, 327

(56) References Cited

U.S. PATENT DOCUMENTS

| | | | | |
|---|---|---|---|---|
| 4,797,579 A | * | 1/1989 | Lewis ......................... | 326/27 |
| 5,008,563 A | * | 4/1991 | Kenney et al. .............. | 327/176 |
| 5,448,311 A | * | 9/1995 | White et al. ................. | 348/707 |
| 5,689,257 A | * | 11/1997 | Mercer et al. .............. | 341/133 |
| 5,767,699 A | | 6/1998 | Bosnyak | |
| 5,949,253 A | | 9/1999 | Bridgewater | |
| 6,069,927 A | * | 5/2000 | Kikuchi ....................... | 375/357 |
| 6,194,949 B1 | * | 2/2001 | Hogeboom ................... | 327/391 |
| 6,266,383 B1 | * | 7/2001 | Kikuchi ....................... | 375/358 |
| 6,292,014 B1 | * | 9/2001 | Hedberg ....................... | 326/30 |
| 6,294,933 B1 | * | 9/2001 | Chun et al. .................. | 326/86 |
| 6,310,569 B1 | * | 10/2001 | Chaudhry et al. .......... | 341/144 |
| 6,362,608 B1 | * | 3/2002 | Ashburn et al. ............ | 323/272 |
| 6,362,672 B1 | * | 3/2002 | Geist ........................... | 327/170 |
| 6,377,095 B1 | * | 4/2002 | Kuo ............................. | 327/170 |
| 6,380,777 B1 | * | 4/2002 | Degardin et al. ........... | 327/170 |
| 6,384,682 B2 | * | 5/2002 | Maeda et al. ................ | 330/253 |
| 6,388,943 B1 | * | 5/2002 | Schell et al. ................ | 365/233 |
| 6,411,126 B1 | * | 6/2002 | Tinsley et al. ................ | 326/83 |
| 6,426,656 B1 | * | 7/2002 | Dally et al. ................... | 327/51 |
| 6,437,599 B1 | * | 8/2002 | Groen .......................... | 326/63 |
| 6,452,428 B1 | * | 9/2002 | Mooney et al. ............. | 327/108 |
| 6,597,233 B2 | * | 7/2003 | Ray ............................. | 327/424 |
| 6,686,772 B2 | * | 2/2004 | Li et al. ....................... | 326/83 |
| 6,771,126 B2 | * | 8/2004 | Blankenship et al. ....... | 330/257 |

FOREIGN PATENT DOCUMENTS

JP        2000059199        2/2000

* cited by examiner

*Primary Examiner*—John R. Cottingham
*Assistant Examiner*—Nitin C. Patel
(74) *Attorney, Agent, or Firm*—Christopher P. Maiorana, P.C.

(57) ABSTRACT

An apparatus comprising a first plurality of parallel switches and a second plurality of parallel switches. The first plurality of parallel switches may be configured to control a voltage on a first output pin. The second plurality of parallel switches may be configured to control a voltage on a second output pin. The first and second pluralities of parallel switches may be configured to provide rise time control of a differential waveform and be driven by a phased data signal.

21 Claims, 5 Drawing Sheets

US 6,931,560 B1

PROGRAMMABLE TRANSMIT SCSI EQUALIZATION

FIELD OF THE INVENTION

The present invention relates to a method and/or architecture for implementing transceivers generally and, more particularly, to programmable transmit SCSI equalization.

BACKGROUND OF THE INVENTION

Referring to FIG. 1, a schematic of a conventional current mode small computer systems interface (SCSI) universal low voltage differential (ULVD) driver 10 is shown. The driver 10 has a number of transistors labeled A–D, a driver 12, a current source 14, a current source 16, a positive output pin 18, a negative output pin 20 and a terminator 22. Input data is presented to the transistors A and C and the transistors B and D in a differential configuration. Conventional current mode SCSI ULVD drivers do not control output rise time of output differential waveforms.

It is generally desirable to provide a method and/or architecture that may overcome SCSI cable induced effects by providing a controlled rise time and synchronized buffers for precompensation.

SUMMARY OF THE INVENTION

The present invention concerns an apparatus comprising a first plurality of parallel switches and a second plurality of parallel switches. The first plurality of parallel switches may be configured to control a first voltage on a first output pin. The second plurality of parallel switches may be configured to control a second voltage on a second output pin. The first and second pluralities of parallel switches may be configured to provide rise time control of a differential waveform and be driven by a phased data signal.

The objects, features and advantages of the present invention include providing a method and/or architecture for a programmable transmit SCSI equalization device that may (i) provide controlled rise time and/or (ii) provide synchronized buffers for precompensation.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
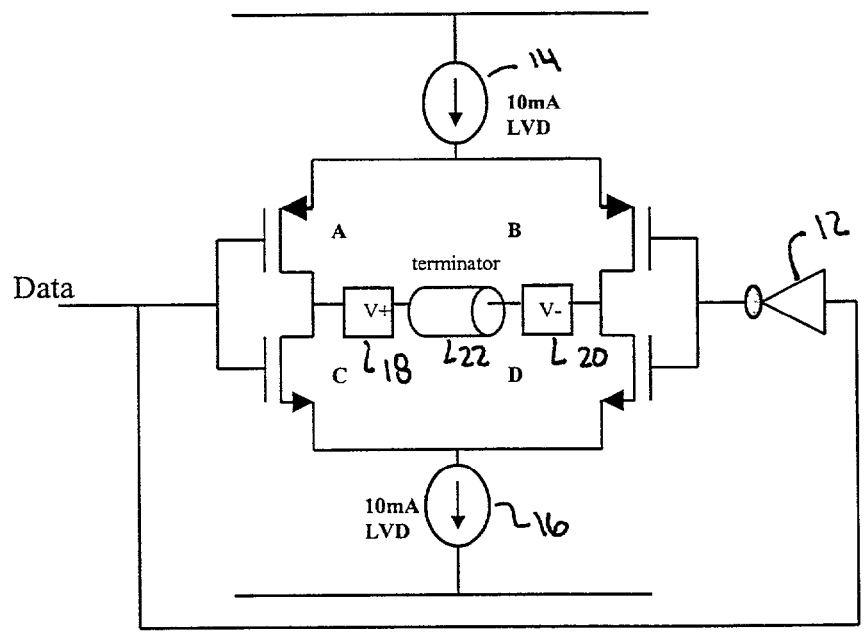
FIG. 1 is a block diagram of a conventional SCSI ULVD driver.
Figure 2:
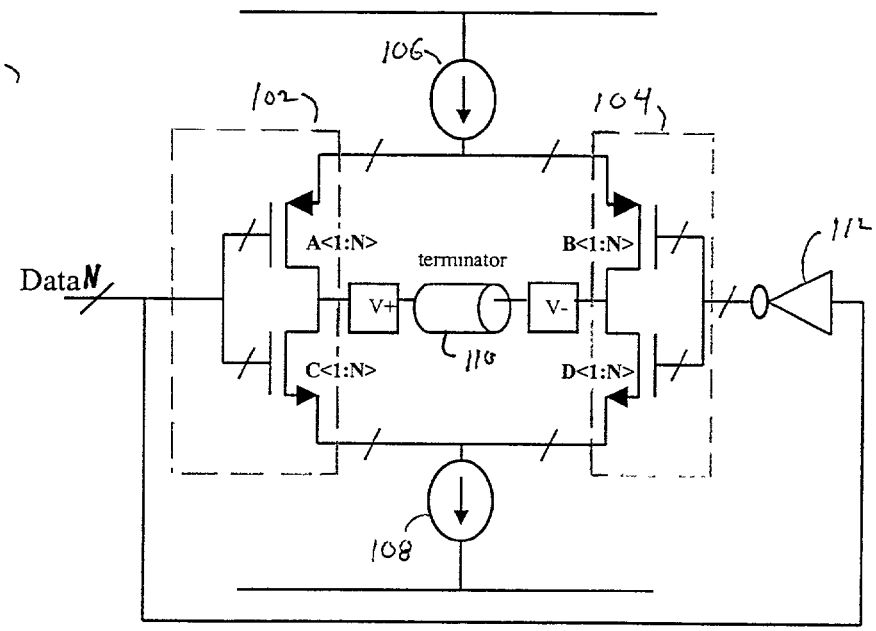
FIG. 2 is a block diagram of a preferred embodiment of the present invention.

Referring to FIG. 2, a block diagram of circuit (or device) 100 is shown in accordance with a preferred embodiment of the present invention. The circuit 100 may be implemented as a small computer systems interface (SCSI) universal low voltage differential (ULVD) transceiver. The circuit 100 may provide a SCSI ULVD driver with precompensation and rise time control. The circuit 100 may be implemented to control rise and fall times with phased data. For example, the circuit 100 may provide controlled rise time of low voltage differential signals in a SCSI ULVD buffer. The circuit 100 may be configured to provide minimized rise time variation of differential drivers over process, voltage, and temperature corners. Additionally, the present invention may provide synchronization of multiple differential drivers (to be described in connection with FIGS. 3 and 4).

The circuit 100 generally comprises a circuit (or device) 102, a circuit (or device) 104, a current source 106, a current source 108, a terminator 110, and an inverter 112. The circuit 100 may also have an output pin (e.g., V+) and an output pin (e.g., V−). The circuit 102 generally comprises a number of parallel switches (e.g., A) and a number of parallel switches (e.g., C). The parallel switches A<1:N> and the parallel switches C<1:N> may be driven by a data signal (e.g., DATA). The data signal DATA may be a phased data signal with N phases, where N is a positive integer. The circuit 104 generally comprises a number of parallel switches (e.g., B) and a number of parallel switches (e.g., D). The parallel switches B<1:N> and the parallel switches D<1:N> may be driven by a complement of the phased data signal DATA. A number of each of the parallel switches A, B, C and D may be varied in order to meet the criteria of a particular implementation.

The switches A, B, C and D may be implemented as ULVD rise time control switches. The circuit 100 may implement rise time control by implementing N parallel switches (e.g., the switches A<1:N>, B<1:N>, C<1:N> and D<1:N>) driven by a phased data signal (e.g., the signal DATAN). The circuit 100 may break the output switches A, B, C and D in to multiple segments and drive them with the multiphase data signal DATAN. The timing between a first and a last data phase (e.g., DATA1 and DATAN) of the signal DATA may determine rise and fall times of an output differential waveform on the pins V+ and V−. The switches A, B, C and D may also be weighted to influence a pulse shape of the differential waveform.

Figure 3:
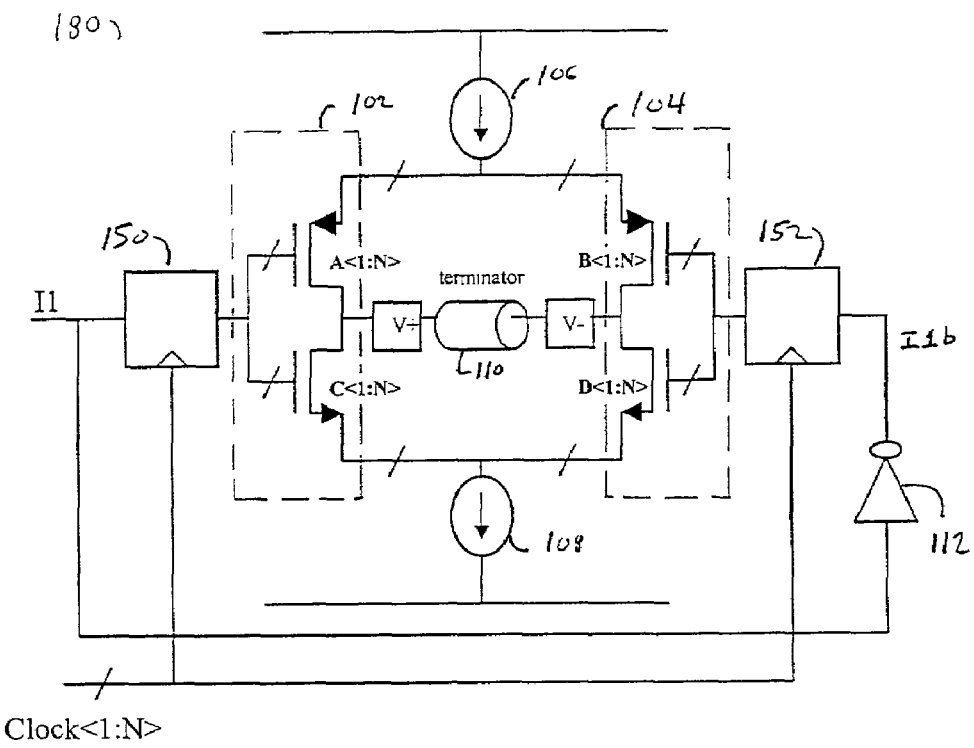
FIG. 3 is a block diagram of an alternate embodiment of the present invention.

Referring to FIG. 3, a block diagram of a circuit 180 illustrating an exemplary embodiment of the circuit 100 is shown. The circuit 180 may be similar to the circuit 100. The circuit 180 may be configured to synchronize multiple buffers. The circuit 180 may allow phased data to be created from a centrally generated phased clock. The circuit 180 may also allow two differential devices to become synchronized by a common phased clock (to be discussed further in connection with FIG. 4). The circuit 180 may additionally comprise a flip-flop 150 and a flip-flop 152. The flip-flops 150 and 152 may be implemented as output driver switches. The FF 150 may receive a signal (e.g., I1). The FF 152 may receive a signal (e.g., I1b). The FFs 150 and 152 may also receive a clock signal (e.g., CLOCK). The clock signal CLOCK may be implemented as a multiphase clock signal.

Figure 4:
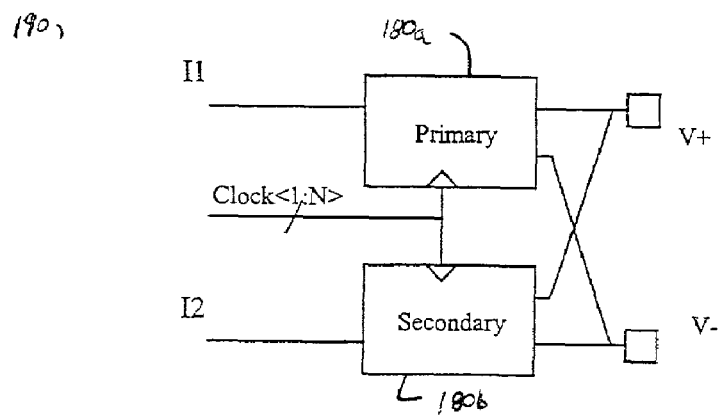
FIG. 4 is a block diagram of an exemplary implementation of the present invention.

Referring to FIG. 4, a block diagram of a circuit (or device) 190 illustrating an exemplary implementation of the present invention is shown. The circuit 190 generally comprises a driver 180a and a driver 180b. The circuit 190 may illustrate a precompensation implementation of the present invention. The drivers 180a and 180b may be similar to the driver 100 (or 180). The drivers 180a and 180b may be configured to line up timing between the output pins V+ and V−. The driver 180a may be implemented as a main driver and the driver 180b may be implemented as a secondary driver. For example, SCSI Ultra4 I/O may require two parallel drivers (e.g., the driver 180a and 180b) in order to perform pre-emphasis on transmitted data. The drivers 180a and 180n may provide pre-emphasis that may mitigate the effects of intersymbol interference (ISI). The signal I1 may be implemented as data signal. The signal I2 may be implemented as a precompensation signal of the signal I1.

In order to synchronize the timing, on the drivers 180a and 180b, the circuit 190 may implement the flip-flops 150 and 152. The multiphase clock CLOCK<1:N> may drive both the main driver 180a and the secondary driver 180b. However, the clock CLOCK<1:N> may be implemented to drive any number of buffers. The multiphase clock CLOCK<1:N> may be implemented to create a multiphase data pattern to the output driver switches.

The circuit 190 is shown comprising two drivers (e.g., the drivers 180a and 180b). However, another appropriate number of drivers may be implemented to meet the criteria of a particular implementation. Additionally, for a higher number of drivers 180a–180n implemented in the circuit 190, higher orders of precompensation may be achieved.

Figure 5:
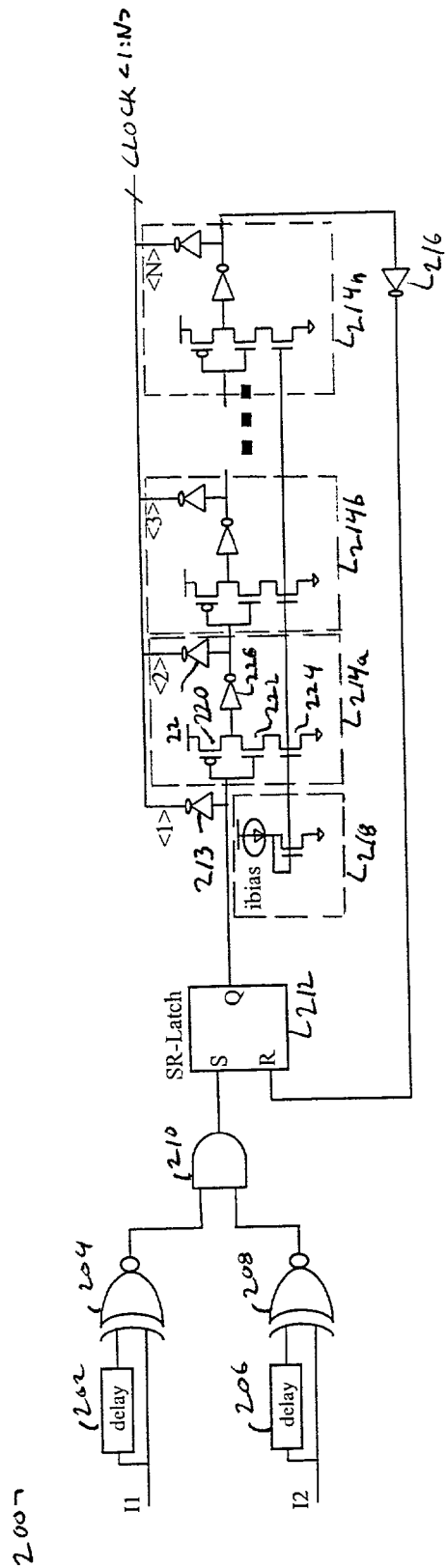
FIG. 5 is a block diagram of a clock generation circuit in conjunction with the present invention.

Referring to FIG. 5, a block diagram of a timing device (or circuit) 200 is shown. The timing circuit 200 may be used in conjunction with the present invention to generate the multiphase clock signal CLOCK<1:N>. The timing circuit 200 may also be configured to control rise time variation. The circuit 200 may generate clock phases from an edge transition on either the data signal I1 or the precompensation signal I2.

The timing circuit 200 generally comprises a delay device 202, a gate 204, a delay device 206, a gate 208, a gate 210, a latch 212, an inverter 213, a number of clock phase generation circuits 214a–214n, an inverter 216 and a bias circuit 218. A number of clock phase generation circuits 214a–214n may be varied in order to meet the criteria of a particular implementation. The gates 204 and 208 may be implemented as XNOR gates and the gate 210 may be implemented as an AND gate. However, other types of gates may be implemented in order to meet the design criteria of a particular implementation.

The data signal I1 may be presented to the delay circuit 202 and the gate 204. The gate 204 may also receive an output of the delay circuit 202. The precompensation signal I2 may be presented to the delay circuit 206 and the gate 208. The gate 208 may also receive an output of the delay 206. The gate 204 and the gate 208 may present a signal to the gate 210. The gate 210 may present a signal to a set input of the latch 212. The latch 212 may present an output signal to the inverter 213 and the clock phase generation circuit 214a. The inverter 213 may generate the clock signal CLOCK<1>.

The clock phase generation circuits 214a–214n may be coupled in a series configuration. The clock phase generation circuits 214a–214n may be configured to generate the signals CLOCk<2:N>. The clock signal CLOCK<N> may be presented to the inverter 216. The inverter 216 may then present a signal to a reset input of the latch 212. The latch 212 may be configured to control the phases of the clock CLOCK<1:N> via the phase clock generation circuits 214a–214n. Additionally, the bias circuit 218 may be configured to control the circuit 214a–214n. The bias circuit 218 may be controlled by a signal (e.g., IBIAS).

Each of the clock phase generation circuits 214a–214n generally comprises a transistor 220, a transistor 222, a transistor 224, an inverter 226 and an inverter 228. A source of the transistor 220 may be coupled to a power supply, a gate of the transistor 220 may be coupled to a proceeding output, and a drain of the transistor 220 may be coupled to a source of the transistor 222. A gate of the transistor 222 may be coupled to the proceeding output and a drain of the transistor 222 may be coupled to a source of the transistor 224. A gate of the transistor 224 may receive a bias output of the bias circuit 218 and a drain of the transistor 224 may be coupled to ground.

The inverter 226 may receive the drain of the transistor 220/the source of the transistor 222. The inverter 226 may present a signal to a next clock phase generation circuit. The inverter 228 may receive the output of the inverter 226 and present a phase of the signal CLOCK.

The timing circuit 200 may synchronize multiple differential drivers with a centralized delay line to generate the multiphase clock CLOCK<1:N> from data edge transitions. The multiphase clock CLOCK<1:N> may then drive an array of flip-flops (e.g., the flip-flops 150 and 152) to generate the differential waveform output on the pins V+ and V−. Additionally, the timing circuit 200 may implement a PLL (or DLL) to create the multiphase clock delay line bias current IBIAS. However, other appropriate clock generation techniques may be implemented.

The timing circuit 200 may be configured to provide edge rate control. The circuit 100 may also allow the timing circuit 200 to be implemented for multiple transmitters. The timing circuit 200 may also allow for the precise synchronization of several outputs and several parallel transmitters to be precisely synchronized for multi-level transmit.

Figure 6:
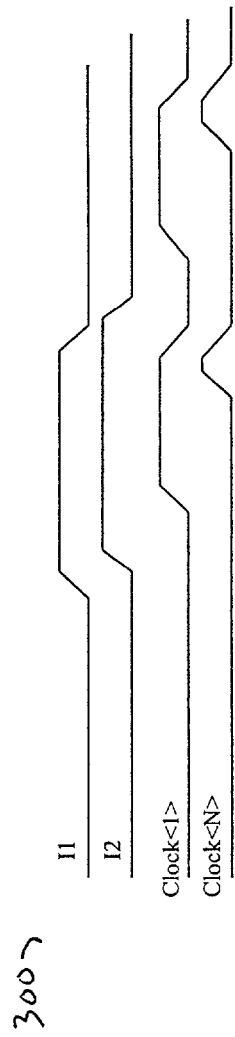
FIG. 6 is a timing diagram of the circuit of FIG. 5.

Referring to FIG. 6, a timing diagram 300 illustrating an operation of the timing circuit 200 is shown. A time from a transition of the signal CLOCK<1> to a transition of the signal CLOCK<N> may set the rise and fall times for each differential output stage 214a–214n and may be controlled by the current source IBIAS. For example, in SCSI Ultra4, the control signal IBIAS may be a process, voltage, and temperature (PVT), compensated source providing 1.5:1 delay variation. The PVT compensation may be adjusted with control bits from about 40 $\mu$A to 80 $\mu$A. Additionally, the signal IBIAS may be designed to further track PVT variation by using a PLL (or DLL) with a delay in the control loop being composed of the delay circuits 202 and 206. The signal CLOCK<1> be delayed from the signals I1 and I2 to provide sufficient set-up time on the flip-flops 150 and 152. However, the signal CLOCK<N> may not be delayed beyond a hold-time of the flip-flops 150 and 152.

Figure 7:
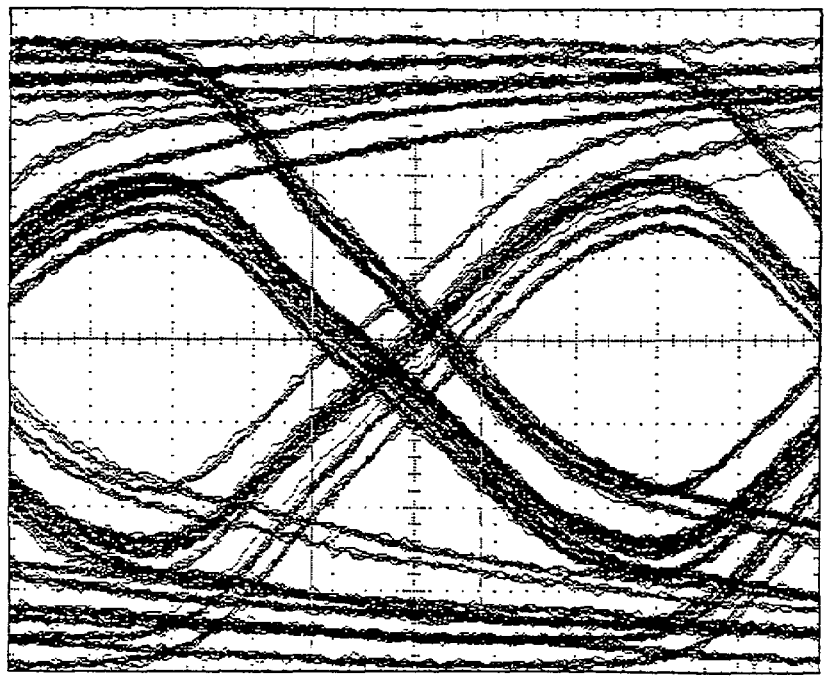
FIG. 7 is a timing diagram of an operation of typical bandwidth effects over a transfer medium without pre-emphasis.

Referring to FIG. 7, a timing diagram 500 of a typical transmission operation without pre-emphasis is shown. The timing diagram 500 may illustrate the eye of data transmitted over 25 meters of cable. The timing diagram 500 may illustrate the bandwidth-limiting effects (ISI) of the cable on data transmitted without pre-emphasis.

Figure 8:
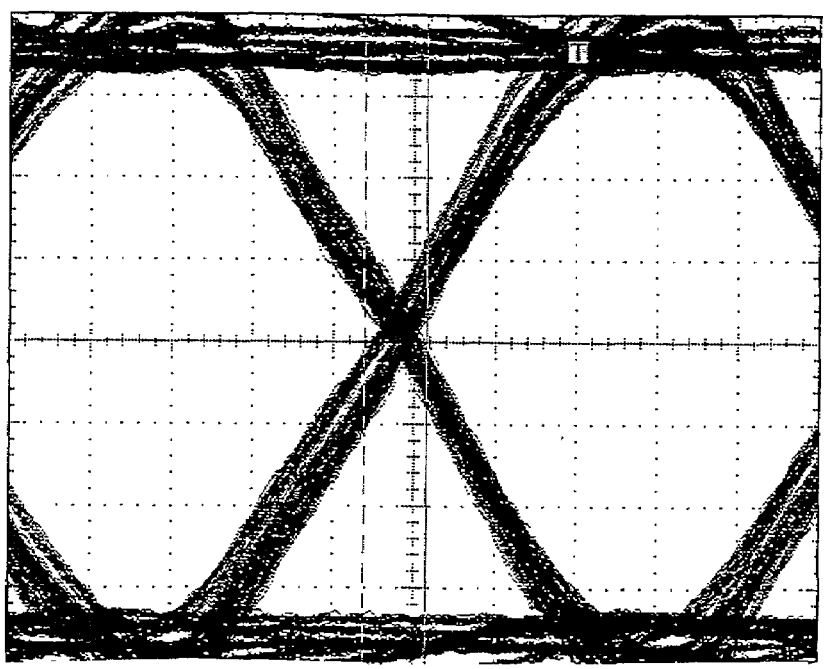
FIG. 8 is a timing diagram of an operation of the present invention.

Referring to FIG. 8, a timing diagram 600 illustrating an operation of the present invention is shown. The timing diagram 600 may illustrate the eye of data transmitted over 25 meters of cable with pre-emphasis. The timing diagram 600 may have a significant improvement in ISI distortion with respect to the timing diagram 500.

Figure 9:
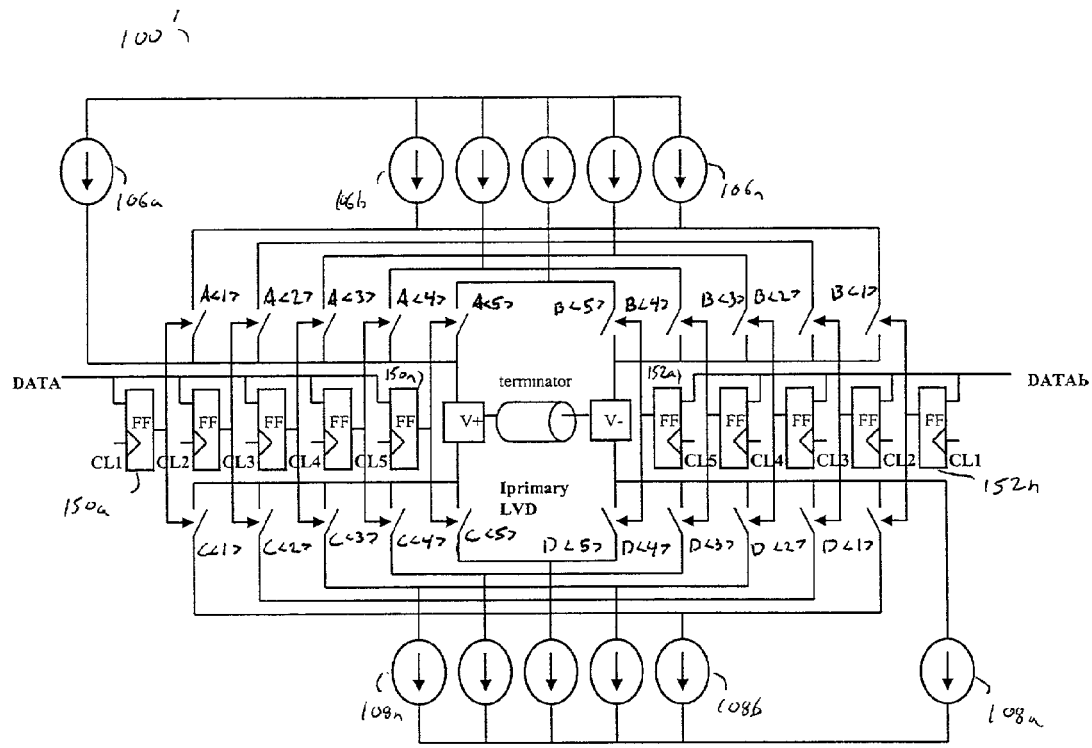
FIG. 9 is a block diagram of an alternate embodiment of the present invention.

Referring to FIG. 9, a block diagram of a circuit 100' is shown illustrating a five phase SCSI driver. The circuit 100' may be similar to the circuit 100. The circuit 100' may comprise a number of current sources 106a–106n and 108a–108n and a number of flip-flops 150a–150n and 152a–152n. A number of current sources 106a–106n, current sources 108a–108n, flip-flops 150a–150n and flip-flops 152a–152n may be varied in order to meet the criteria of a particular implementation. The current sources 106a–106n and 108a–108n may be weighted to influence pulse shapes of the differential waveform. The switches A, B, C and D may also be weighted. In one example, the circuit 100 may implement the individual current sources 106a–106n and 108a–108n and the equally weighted switches A, B, C, and D to control current switching. The circuit 100' may also implement a number of clock phases (e.g., CL1, CL2, CL3, CL4 and CL5).

The current sources 106a–106n may be implemented as P-channel current sources. The switches A and B may be implemented as P-channel switches. The current sources 108a–108n may be implemented as N-channel current sources. The switches C and D may be implemented as N-channel switches. In one example, each of the current sources 106a–106n and 108a–108n may be implemented as a 2 mA current source. However, the particular size of the current sources 106a–106n and 108a–108n may be varied accordingly to meet the design criteria of a particular implementation. Additionally, the current source 106a and the current source 108a may act as offset cancellation current sources.

In one example, five switches with equal weighting and combined current sources are typically implemented for SCSI Ultra3. SCSI Ultra3 I/O devices may control rise time with a 3:1 variation across PVT. In another example, five switches with binary (e.g., 1,2,4,2,1) weighting may be implemented for SCSI Ultra4. SCSI Ultra4 may implement binary switch weighting to open the eye (to be discussed in connection with FIGS. 7 and 8). SCSI Ultra4 may also use a current controlled delay line for generation of multiphase data. The current controlled delay line may provide 1.5:1 variation across PVT. Such an implementation may improve operation of conventional SCSI Ultra4 devices.

Figure 10:
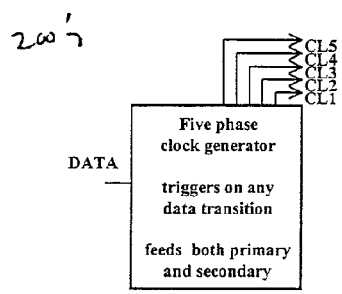
FIG. 10 is a block diagram of a timing circuit of the circuit of FIG. 9.

Referring to FIG. 10, a circuit 200' is shown. The circuit 200' may be similar to the circuit 200. The circuit 200' may be configured to generate the clock phases CL1–CL5. The circuit 200' may generate the clock phases CL1–CL5 in response to the signal DATA. The clock generation circuit 200' may trigger on data transitions of the signal DATA.

Conventional LVD transmitters in multi-drop cable environments require edge-rate control to avoid generation of crosstalk and reflection noise. However, such conventional solutions are configured to slow down the output data at the output (or last) stage for a timed transition at the output. The circuit 100 may be configured to separate the timing for LVD edge-rate control out of the critical data path. Specifically, the timing circuit 200 may not be implemented in the critical data path. Therefore, the timing circuit 200 may not delay the output differential waveform of the circuit 100. The circuit 100 may detect when the output on the pins V+ and V– is about to change state and trigger the timing circuit 200 to control the transmitted edge rate.

The circuit 100 may implement the parallel drivers 180a and 180b to improve transmitter ISI precompensation. The circuit 100 may also implement the parallel weighted current sources 106a–106n and 108a–108n to improve ISI precompensation. The circuit 100 may implement weighted switching to improve the transition levels in the current-mode driver 100 (or 190). The overall impedance of the switches A, B, C and D may be set by a predetermined common-mode range requirement. The individual impedance of each switch A, B, C, and D may be optimized, such that when turning on the total resistance of all switches N, at a particular point changes by 1/N. The circuit 100 may therefore avoid a case when first and last switch are small compared to the termination resistance.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first plurality of parallel switches configured to (i) each receive a multiphased data signal having N phases, where N is a positive integer and (ii) control a voltage on a first output pin; and
   a second plurality of parallel switches configured to (i) each receive a digital complement of said multiphased data signal and (ii) control a voltage on a second output pin, wherein said first and second pluralities of parallel switches are configured to provide rise time control of a differential waveform.

2. The apparatus according to claim 1, wherein a timing between a first and a last phase of said multiphased data signal is configured to determine a rise and fall time of said differential waveform.

3. The apparatus according to claim 1, wherein each of said first and second pluralities of parallel switches are weighted to determine a pulse shape of said differential waveform.

4. The apparatus according to claim 1, further comprising:
   one or more current sources configured to provide current to each of said first and second pluralities of parallel switches.

5. The apparatus according to claim 4, wherein said one or more current sources comprises parallel current sources.

6. The apparatus according to claim 5, wherein each of said parallel current sources are weighted to determine a pulse shape of said differential waveform.

7. The apparatus according to claim 1, further comprising:
   a first driver configured in parallel; and
   a second driver configured in parallel, wherein said first and second drivers are configured to synchronize to a phased clock signal.

8. The apparatus according to claim 7, wherein said first and second drivers are configured to perform pre-emphasis on said differential waveform.

9. The apparatus according to claim 8, wherein said first and second drivers are configured to mitigate effects of intersymbol interference (ISI).

10. The apparatus according to claim 7, wherein said first driver comprises a main driver and said second driver comprises a secondary driver.

11. The apparatus according to claim 7, wherein said first driver comprises one or more flip-flops and said second driver comprises one or more flip-flops.

12. The apparatus according to claim 7, wherein said first and second drivers are clocked by a multiphase clock signal.

13. The apparatus according to claim 12, further comprising:
   a clock generation circuit configured to generate said multiphase clock in response to a data signal and a precompensation signal.

14. The apparatus according to claim 1, wherein a first phase and a second phase of a multiphase clock signal are configured to set a rise and fall time for said differential waveform.

15. The apparatus according to claim 14, wherein generation of said first phase and said second phase are controlled by a bias.

16. The apparatus according to claim 1, wherein said apparatus is configured to overcome cable induced effects.

17. The apparatus according to claim 1, wherein said apparatus is further configured to synchronize a plurality of drivers to provide precompensation.

18. The apparatus according to claim 1, wherein said positive integer N, is three or more.

19. An apparatus comprising:
   means for controlling a voltage on a first output pin with a first plurality of parallel switches each receiving a multiphased data signal having N phases, where N is a positive integer;
   means for controlling a voltage on a second output pin with a second plurality of parallel switches each receiving a digital complement of said multiphased data signal; and
   means for providing rise time control of a differential waveform, wherein said first and second pluralities of parallel switches are driven by a phased data signal.

20. A method for implementing small computer systems interface (SCSI) equalization, comprising the steps of:
   (A) controlling a voltage on a first output pin with a first plurality of parallel switches each receiving a multiphased data signal having N phases, where N is a positive integer;
   (B) controlling a voltage on a second output pin with a second plurality of parallel switches each receiving a digital complement of said multiphased data signal; and
   (C) providing rise time control of a differential waveform, wherein said first and second pluralities of parallel switches are driven by a phased data signal.

21. An apparatus comprising:
   a first plurality of parallel switches configured to control a voltage on a first output pin;
   a second plurality of parallel switches configured to control a voltage on a second output pin, wherein said first and second pluralities of parallel switches are configured to provide rise time control of a differential waveform and are driven by a phased data signal;
   a first driver and a second driver configured in parallel, wherein said first and second drivers (i) are configured to synchronize to a phased clock signal and (ii) are clocked by a multiphase clock signal; and
   a clock generation circuit configured to generate said multiphase clock in response to a data signal and a precompensation signal, wherein a first phase and a second phase of said multiphase clock signal are configured to set a rise and fall time for said differential waveform.

* * * * *